(12) United States Patent
Taniguchi et al.

(10) Patent No.: US 12,525,579 B2
(45) Date of Patent: Jan. 13, 2026

(54) SEMICONDUCTOR DEVICE AND METHOD FOR PRODUCING SAME

(71) Applicant: Resonac Corporation, Tokyo (JP)

(72) Inventors: Kohei Taniguchi, Tokyo (JP); Yoshinobu Ozaki, Tokyo (JP); Kei Itagaki, Tokyo (JP); Kazuhiro Yamamoto, Tokyo (JP); Kanami Nakamura, Tokyo (JP); Hiroki Hashimoto, Tokyo (JP)

( * ) Notice: Subject to any disclaimer, the term of this patent is extended or adjusted under 35 U.S.C. 154(b) by 368 days.

(21) Appl. No.: 18/003,345

(22) PCT Filed: Jul. 1, 2021

(86) PCT No.: PCT/JP2021/024974
§ 371 (c)(1),
(2) Date: Dec. 27, 2022

(87) PCT Pub. No.: WO2022/004849
PCT Pub. Date: Jan. 6, 2022

(65) Prior Publication Data
US 2023/0253366 A1    Aug. 10, 2023

(30) Foreign Application Priority Data
Jul. 3, 2020   (JP) ................. 2020-115568

(51) Int. Cl.
*H01L 25/065* (2023.01)
*H01L 23/31* (2006.01)
(Continued)

(52) U.S. Cl.
CPC ...... *H01L 25/0657* (2013.01); *H01L 23/3142* (2013.01); *H10B 41/20* (2023.02); *H10B 43/20* (2023.02); *H10B 80/00* (2023.02)

(58) Field of Classification Search
CPC ........ H10B 43/20; H10B 41/20; H10B 80/00; H01L 23/3142
See application file for complete search history.

(56) References Cited

U.S. PATENT DOCUMENTS

| 2010/0219507 A1* | 9/2010 | Misumi ............... H01L 24/32 438/464 |
| 2013/0062758 A1* | 3/2013 | Imoto ............... H01L 23/49894 257/737 |
| 2014/0167291 A1* | 6/2014 | Nam ............... H01L 25/0657 257/777 |

FOREIGN PATENT DOCUMENTS

| JP | 2010-024427 | 2/2010 |
| JP | 2014-053538 | 3/2014 |

(Continued)

OTHER PUBLICATIONS

International Search Report dated Sep. 14, 2021 for PCT/JP2021/024974.
(Continued)

*Primary Examiner* — Walter H Swanson
(74) *Attorney, Agent, or Firm* — SHIPWAY IP

(57) ABSTRACT

A semiconductor device includes: a substrate; an adhesive member arranged on a surface of the substrate; a first chip stacked on the adhesive member with a first adhesive piece interposed therebetween; and a second chip stacked on the first chip with a second adhesive piece interposed therebetween. The adhesive member has a multilayer structure including a pair of surface layers formed of a cured product of a thermosetting resin composition and an intermediate layer arranged between the pair of surface layers.

20 Claims, 17 Drawing Sheets

(51) Int. Cl.
   *H10B 41/20* (2023.01)
   *H10B 43/20* (2023.01)
   *H10B 80/00* (2023.01)

(56) References Cited

FOREIGN PATENT DOCUMENTS

| KR | 10-2008-0020396 | 3/2008 |
| TW | 200634935 | 10/2006 |
| TW | 200725918 | 7/2007 |
| TW | 201221614 | 6/2012 |
| TW | I575670 | 3/2017 |
| WO | 2005/103180 | 11/2005 |
| WO | 2020/100308 | 5/2020 |
| WO | 2020/218523 | 10/2020 |

OTHER PUBLICATIONS

International Preliminary Report on Patentability with Written Opinion dated Jan. 12, 2023 for PCT/JP2021/024974.

* cited by examiner

SEMICONDUCTOR DEVICE AND METHOD FOR PRODUCING SAME

CROSS-REFERENCE TO RELATED APPLICATIONS

This application is a 35 U.S.C. § 371 national phase application of PCT/JP2021/024974, filed on Jul. 1, 2021, which claims priority to Japanese Patent Application No. 2020-115568, filed on Jul. 3, 2020.

TECHNICAL FIELD

The present disclosure relates to a semiconductor device and a method for manufacturing the same.

BACKGROUND ART

A semiconductor device is manufactured through the following steps. First, a semiconductor wafer is fixed with an adhesive sheet for dicing. In this state, the semiconductor wafer is separated into individual semiconductor chips. Then, an expanding step, a pick-up step, a die bonding step, a reflow step, and the like are performed.

One of the important characteristics required for semiconductor devices is connection reliability. In order to improve connection reliability, film-shaped adhesives for die bonding have been developed in consideration of characteristics such as heat resistance, moisture resistance, and reflow resistance. For example, Patent Literature 1 discloses an adhesive sheet containing a filler and a resin containing a high molecular weight component and a thermosetting component whose main component is an epoxy resin.

CITATION LIST

Patent Literature

Patent Literature 1: International Publication WO 2005/103180

SUMMARY OF INVENTION

Technical Problem

The present inventors have developed a process for efficiently manufacturing a semiconductor device (for example, a three-dimensional NAND memory) with an increased capacity by stacking semiconductor chips (hereinafter, simply referred to as "chips") in multiple stages. Since a three-dimensional NAND wafer includes a complicated circuit layer and a relatively thin semiconductor layer (for example, about 15 to 25 µm), semiconductor elements obtained by singulating the three-dimensional NAND wafer have a problem that warping is likely to occur.

FIG. 17A is a cross-sectional view schematically showing a structure in a semiconductor device manufacturing process. A structure 30 shown in FIG. 17A includes a substrate 10 and four chips T1, T2, T3, and T4 stacked on the substrate 10. The four chips T1, T2, T3, and T4 are stacked at positions shifted from each other in the horizontal direction (direction perpendicular to the stacking direction) for electrical connections by wires. The chip T1 is bonded to the substrate 10 by an adhesive piece A1, and adhesive pieces A2, A3, and A4 are interposed between semiconductor elements T1, T2, T3 and T4.

According to the studies of the present inventors, when each of the chips T1, T2, T3, and T4 has a complicated circuit layer (top surface side) and a relatively thin semiconductor layer (bottom surface side), as shown in FIG. 17B, peeling is likely to occur between the chip T1 in the first stage and the adhesive piece A2. The reason for this is speculated by the present inventors as follows.

- As described above, the semiconductor elements T1, T2, T3, and T4 tend to warp (have warping stress) due to the complicated circuit layer and the thin semiconductor layer.
- An overhang portion H is formed due to stacking a plurality of chips with their positions shifted from each other in the horizontal direction.
- It has already been confirmed that peeling does not occur when the mounting of the chip T2 in the second stage is completed. Therefore, by mounting the third and fourth chips T2 and T3 in the third and fourth stages, an upward force (warping stress in a direction of peeling from the chip T1 in the first stage) increases in the overhang portion H of the chip T2 in the second stage.

The present disclosure provides a semiconductor device, which includes a plurality of stacked chips and which can sufficiently suppress the occurrence of peeling due to warping of the chips inside the semiconductor device, and a method for efficiently manufacturing the same.

Solution to Problem

A first aspect of a semiconductor device of the present disclosure includes: a substrate; an adhesive member arranged on a surface of the substrate; a first chip stacked on the adhesive member with a first adhesive piece interposed therebetween; and a second chip stacked on the first chip with a second adhesive piece interposed therebetween. The adhesive member has a multilayer structure including a pair of surface layers formed of a cured product of a thermosetting resin composition and an intermediate layer arranged between the pair of surface layers.

According to the semiconductor device according to the first aspect, since the interface on which the warping stress is likely to concentrate is formed by the adhesive member and the first adhesive piece, a sufficiently high adhesive strength can be obtained. Therefore, it is possible to suppress the occurrence of peeling at the interface. In addition, since the adhesive member has a multilayer structure including a pair of surface layers formed of a cured product of a thermosetting resin composition and an intermediate layer arranged between the pair of surface layers as described above, it is possible to suppress the warping of the chip itself even if the adhesive member is relatively thick. That is, compared with a case where the entire adhesive member is formed of a thermosetting resin composition, the presence of the intermediate layer in the thickness direction can suppress the occurrence of a situation in which the adhesive member becomes uneven in thickness due to the warping stress of the chip in the process of stacking a plurality of chips.

A second aspect of a semiconductor device of the present disclosure includes: a substrate; a chip (for example, a controller chip) arranged on a surface of the substrate; a plurality of support pieces arranged around the chip on the surface of the substrate; an adhesive member supported by the plurality of support pieces and arranged so as to cover the chip; and a first chip stacked on the adhesive member with a first adhesive piece interposed therebetween. The adhesive member has a multilayer structure including a pair of surface layers formed of a cured product of a thermosetting resin composition and an intermediate layer arranged between the pair of surface layers.

According to the semiconductor device according to the second aspect, since the interface on which the warping stress is likely to concentrate is formed by the adhesive member and the first adhesive piece, a sufficiently high adhesive strength can be obtained. Therefore, it is possible to suppress the occurrence of peeling at the interface. In addition, according to the semiconductor device according to the second aspect, since the first chip is arranged so as to cover a chip (for example, a controller chip), it is possible to save the space. In addition, as in the first aspect, since the adhesive member has a multilayer structure, it is possible to suppress the warping of the chip itself. This semiconductor device may further include a second chip stacked on the first chip with a second adhesive piece interposed therebetween.

A third aspect of a semiconductor device of the present disclosure includes: a substrate; a first chip with an adhesive piece arranged on a surface of the substrate; an adhesive member arranged on a surface of the adhesive piece of the first chip with the adhesive piece; and a second chip with an adhesive piece arranged on a surface of the adhesive member, wherein the adhesive member has a multilayer structure including a pair of surface layers formed of a cured product of a thermosetting resin composition and an intermediate layer arranged between the pair of surface layers. According to the semiconductor device, since the interface on which the warping stress is likely to concentrate is formed by the adhesive member and the adhesive piece, a sufficiently high adhesive strength can be obtained. Therefore, it is possible to suppress the occurrence of peeling at the interface. In addition, as in the first aspect, since the adhesive member has a multilayer structure, it is possible to suppress the warping of the chip itself.

A semiconductor device manufacturing method according to the present disclosure includes: a step of stacking a first chip on a surface of an adhesive member with a first adhesive piece interposed therebetween; and a step of stacking a second chip on a surface of the first chip with a second adhesive piece interposed therebetween. The first and second adhesive pieces are formed of a thermosetting resin composition. The adhesive member has a multilayer structure including a pair of surface layers formed of a thermosetting resin composition and an intermediate layer arranged between the pair of surface layers. The adhesive member, the first adhesive piece, and the second adhesive piece are collectively cured.

According to the manufacturing method described above, since the first chip is stacked on the surface of the adhesive member with the first adhesive piece interposed therebetween, the interface on which the warping stress is likely to concentrate can be formed by the adhesive member and the first adhesive piece. For this reason, when stacking chips above the first chip thereafter, even if hardening treatment is performed collectively after stacking a predetermined number of chips without curing the adhesive pieces each time one chip is stacked, it is possible to sufficiently suppress the occurrence of peeling at the interface. The fact that a plurality of adhesive pieces interposed between a plurality of stacked chips can be collectively cured contributes to an improvement in manufacturing efficiency of semiconductor devices.

In the present disclosure, the intermediate layer of the adhesive member is, for example, a polyimide layer or a metal layer from the viewpoint of strength, heat resistance, and the like.

Advantageous Effects of Invention

According to the present disclosure, there are provided a semiconductor device, which includes a plurality of stacked chips and which can sufficiently suppress the occurrence of peeling due to warping of the chips inside the semiconductor device, and a method for efficiently manufacturing the same.

DESCRIPTION OF EMBODIMENTS

Figure 1:
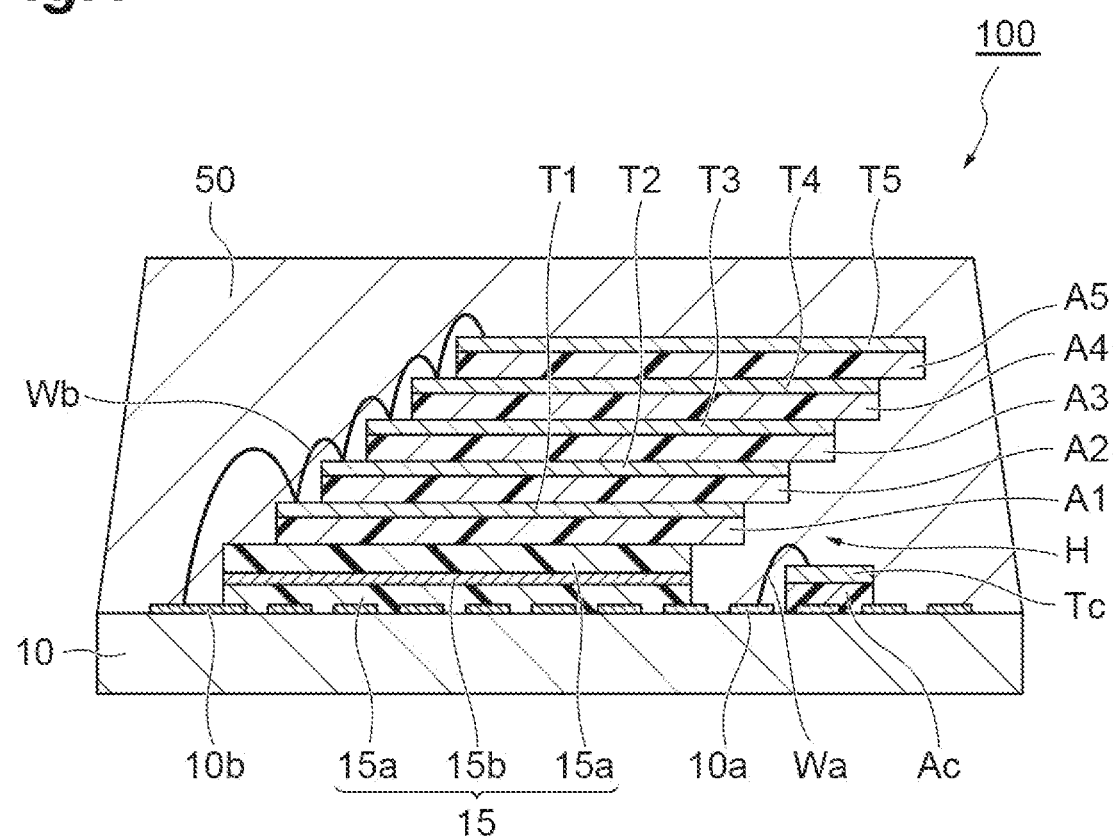
FIG. 1 is a cross-sectional view schematically showing a first embodiment of a semiconductor device according to the present disclosure.

Hereinafter, an embodiment of the present disclosure will be described in detail with reference to the diagrams. In the following description, the same or equivalent portions are denoted by the same reference numerals, and repeated descriptions thereof will be omitted. In addition, it is assumed that the positional relationship such as up, down, left, and right is based on the positional relationship shown in the diagrams unless otherwise specified. In addition, the dimensional ratio of each diagram is not limited to the ratio shown in the diagram. In addition, the description of "(meth) acryl" in this specification means "acryl" and "methacryl" corresponding thereto.

First Embodiment

[Semiconductor Device]

FIG. 1 is a cross-sectional view schematically showing a semiconductor device according to the present embodiment. A semiconductor device 100 shown in this diagram is, for example, a three-dimensional NAND memory. The semiconductor device 100 includes a substrate 10, a controller chip Tc arranged on the surface of the substrate 10, an adhesive member 15 arranged on the surface of the substrate 10, five chips T1, T2, T3, T4, and T5 stacked on the surface of the adhesive member 15, wires Wa and Wb for electrically connecting electrodes 10a and 10b on the surface of the substrate 10 to the chips, and a sealing layer 50 for sealing these. An adhesive piece A1 (first adhesive piece) is arranged between the adhesive member 15 and the chip T1 (first chip). An adhesive piece A2 (second adhesive piece) is arranged between the chip T1 and the chip T2 (second chip). An adhesive piece A3 is arranged between the chip T2 and the chip T3. An adhesive piece A4 is arranged between the chip T3 and the chip T4. An adhesive piece A5 is arranged between the chip T4 and the chip T5. As shown in FIG. 1, a side portion (a part of a peripheral portion) of the chip T1 protrudes laterally from the adhesive member 15. In addition, a side portion (a part of a peripheral portion) of the upper chip (for example, the chip T2) protrudes laterally from the lower chip (for example, the chip T1). Due to these, an overhang portion H is formed.

The substrate 10 may be an organic substrate, or may be a metal substrate such as a lead frame. From the viewpoint of suppressing the warping of the semiconductor device 100, the thickness of the substrate 10 is, for example, 90 to 300 μm, and may be 90 to 210 μm.

The controller chip Tc is bonded to the substrate 10 by an adhesive piece Ac and electrically connected to the electrode 10a by the wire Wa. The shape of the controller chip Tc in plan view is, for example, a rectangle (a square or a rectangle). The length of one side of the controller chip Tc is, for example, 5 mm or less, or may be 2 to 5 mm or 1 to 5 mm. The thickness of the controller chip Tc is, for example, 10 to 150 μm, and may be 20 to 100 μm. The thickness of the adhesive piece Ac is, for example, 5 to 40 μm, and may be 10 to 25 μm. The sum of the thickness of the controller chip Tc and the thickness of the adhesive piece Ac (the distance from the top surface of the substrate 10 to the top surface of the controller chip Tc) is, for example, 25 to 190 μm, and may be 30 to 125 μm.

The adhesive member 15 has a three-layer structure including a pair of surface layers 15a and 15a and an intermediate layer 15b arranged therebetween. Both of the pair of surface layers 15a and 15a are formed of a cured product of a thermosetting resin composition with adhesiveness. The surface layer 15a bonds the chip T1 to the substrate 10 with the adhesive piece A1 interposed therebetween. In the present embodiment, since an interface where warping stress is likely to occur is formed by the adhesive member 15 and the adhesive piece A1, the occurrence of peeling at the interface can be sufficiently suppressed. Since the adhesive member 15 has a multilayer structure, it is possible to suppress the warping of the chip itself even if the adhesive member 15 is relatively thick. That is, compared with a case where the entire adhesive member is formed of a thermosetting resin composition, the presence of the intermediate layer 15b in the thickness direction can suppress the occurrence of a situation in which the adhesive member 15 becomes uneven in thickness due to the warping stress of the chips T1, T2, T3, T4, and T5 in the process of sequentially stacking the chips T1, T2, T3, T4, and T5.

The total thickness of the adhesive member 15 is, for example, 35 to 150 μm, and may be 70 to 90 μm or 40 to 60 μm. The adhesive member 15 is preferably thicker than the sum of the thickness of the controller chip Tc and the thickness of the adhesive piece Ac. Therefore, the controller chip Tc can be arranged on the surface of the substrate 10 and near the overhang portion H side of the chips T1, T2, T3, T4, and T5, and can be connected to the electrode 10a by the wire Wa.

The thickness of the surface layer 15a is, for example, 5 to 40 μm, and may be 5 to 25 μm or 5 to 20 μm. The thicknesses of the two surface layers 15a may be the same, or may be different. The surface layer 15a is formed of a thermosetting resin composition. The thermosetting resin composition can be fully cured (C stage) by subsequent hardening treatment after a semi-cured (B stage) state. The thermosetting resin composition contains an epoxy resin, a curing agent, an elastomer (for example, an acrylic resin), and further contains an inorganic filler, a curing accelerator, and the like when necessary. The compositions of the two surface layers 15a may be the same, or may be different.

The thickness of the intermediate layer 15b is, for example, 5 to 75 μm, and may be 10 to 75 μm or 10 to 50 μm. The intermediate layer 15b is preferably formed of a material with a sufficiently high mechanical strength. Specific examples of materials include resins, such as polyimide and polyethylene terephthalate (PET), and metals, such as copper and aluminum. The tensile modulus of the material forming the intermediate layer 15b is, for example, 8.0 MPa or more, and may be 9.0 MPa or more or 10.0 MPa or more. In addition, when the intermediate layer 15b is formed of a resin material, the intermediate layer 15b is formed of a material different from the resin material forming the surface layer 15a. By making the adhesive member 15 have a plurality of layers formed of different materials, functions can be assigned to respective layers. Therefore, compared with a case where a plurality of layers are formed of the same material, it is possible to improve the functionality of the adhesive member.

(Adhesive Member Manufacturing Method)

An example of an adhesive member manufacturing method will be described. In addition, the surface layer 15a shown in FIG. 1 is after the thermosetting resin composition forming the surface layer 15a is cured. On the other hand, a surface layer 15P and a surface layer 15p obtained by singulating the surface layer 15P are before the thermosetting resin composition contained therein is completely cured (FIGS. 2B and 4B).

Figure 2A:
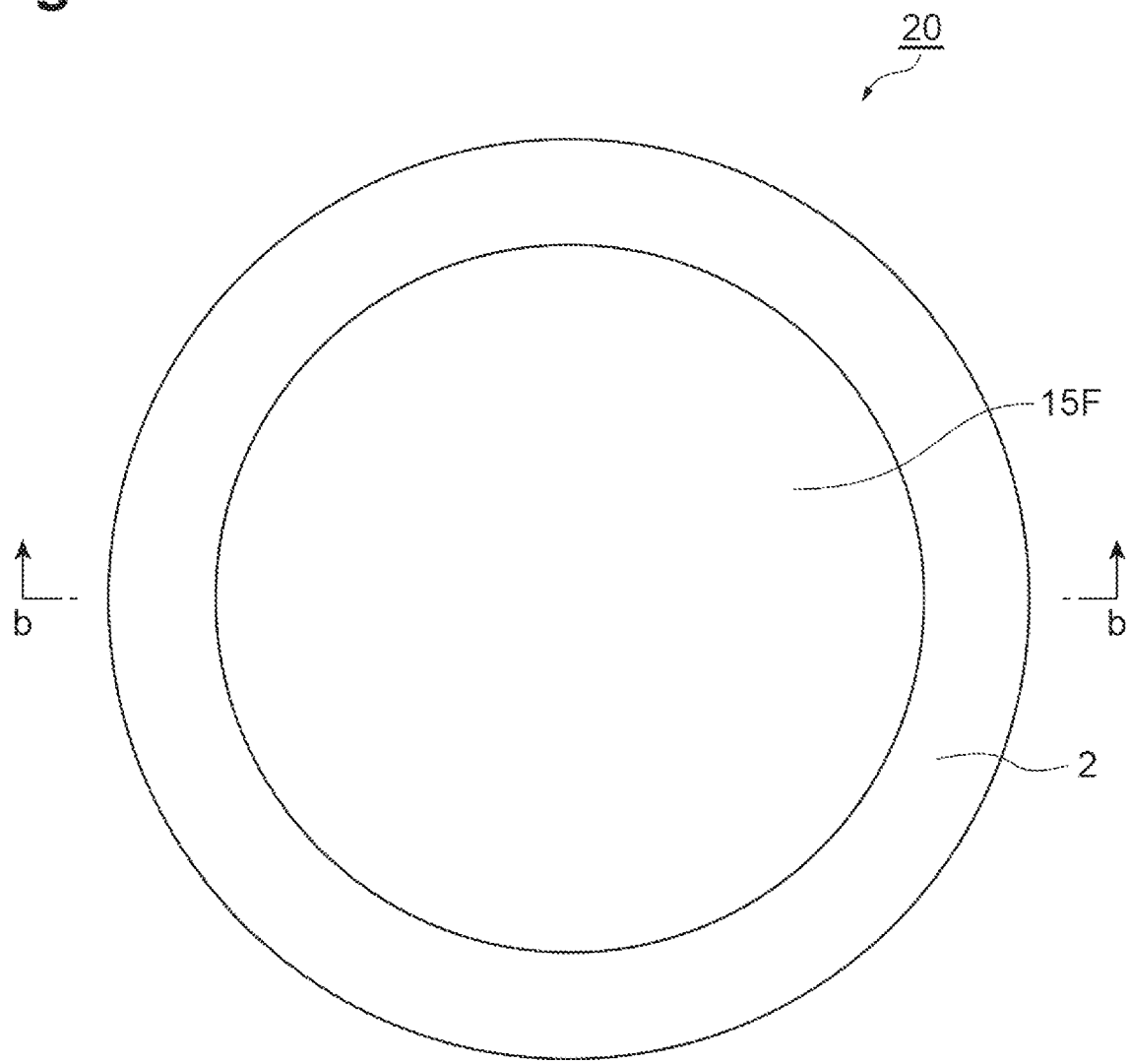
FIG. 2A is a plan view schematically showing an example of a stacked film for forming an adhesive member.
Figure 2B:
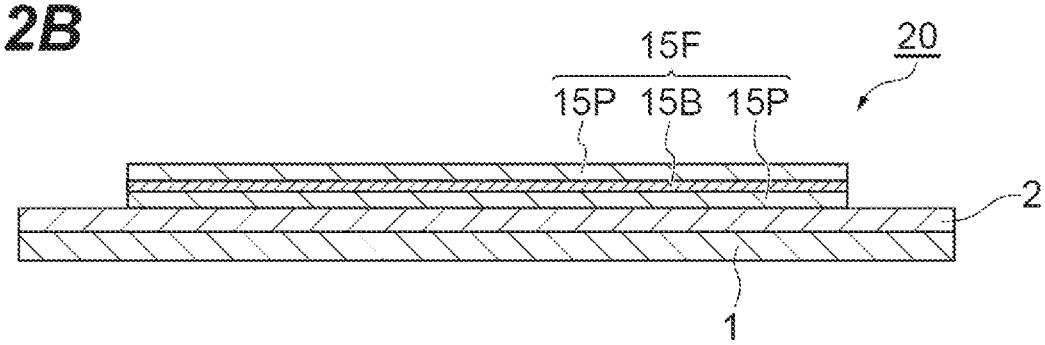
FIG. 2B is a cross-sectional view taken along the line b-b in FIG. 2A.

First, a stacked film for forming an adhesive member 20 (hereinafter, sometimes referred to as a "stacked film 20") shown in FIGS. 2A and 2B is prepared. The stacked film 20 includes a base film 1, an adhesive layer 2, and an adhesive film 15F. The base film 1 is, for example, a polyethylene terephthalate film (PET film). The adhesive layer 2 is formed in a circular shape by punching or the like (see FIG. 2A).

The adhesive layer 2 is formed of, for example, an ultraviolet curable adhesive. The adhesive layer 2 has a property that its adhesiveness is lowered by being irradiated with ultraviolet rays. The adhesive film 15F is formed in a circular shape by punching or the like, and has a smaller diameter than the adhesive layer 2 (see FIG. 2(a)).

The adhesive film 15F is formed by a pair of surface layers 15P, which are thermosetting resin layers, and an intermediate layer 15B interposed therebetween. The thickness of the surface layer 15P is substantially the same as the thickness of the surface layer 15a described above, for example, 5 to 40 μm, and may be 5 to 25 μm or 5 to 20 μm. The thickness of the intermediate layer 15B is the same as the thickness of the intermediate layer 15b described above, for example, 5 to 75 μm, and may be 10 to 75 μm or 10 to 50 μm. The tensile modulus of the intermediate layer 15B is, for example, 8.0 MPa or more, and may be 9.0 MPa or more or 10.0 MPa or more. Since the intermediate layer 15B has a tensile modulus of 8.0 MPa or more, the intermediate layer 15b plays a role like a spring plate in the step of picking up the adhesive member 15 (see FIG. 4D). Therefore, excellent pick-up performance can be achieved. In addition, the upper limit value of the tensile modulus of the intermediate layer 15B is about 15 MPa in terms of availability of materials. Examples of the material forming the intermediate layer 15B include polyimide and polyethylene terephthalate (PET). The intermediate layer 15B may be a layer formed of a thermosetting resin composition or a photocurable resin composition subjected to hardening treatment so that the tensile modulus falls within the above range.

Figure 3:
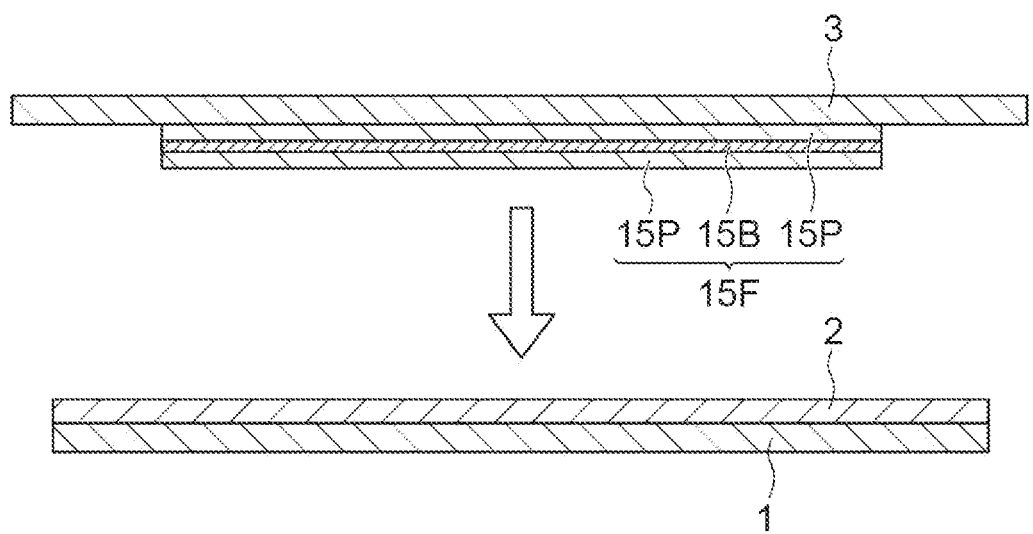
FIG. 3 is a cross-sectional view schematically showing a step of bonding an adhesive layer and a stacked film for forming an adhesive member to each other.

The stacked film 20 can be manufactured, for example, by bonding a first stacked film, which has the base film 1 and the adhesive layer 2 on the surface of the base film 1, and a second stacked film, which has a cover film 3 and the adhesive film 15F on the surface of the cover film 3 (see FIG. 3). The first stacked film is obtained through a step of forming an adhesive layer on the surface of the base film 1 by coating and a step of processing the adhesive layer into a predetermined shape (for example, a circular shape) by punching or the like. The second stacked film is obtained through a step of forming the surface layer 15P on the surface of the cover film 3 (for example, a PET film or a polyethylene film) by coating, a step of forming the intermediate layer 15B on the surface of the surface layer 15P, a step of forming the surface layer 15P on the surface of the intermediate layer 15B by coating, and a step of processing an adhesive film formed through these steps into a predetermined shape (for example, a circular shape) by punching or the like. When using the stacked film 20, the cover film 3 is peeled off at an appropriate timing.

Figure 4A:
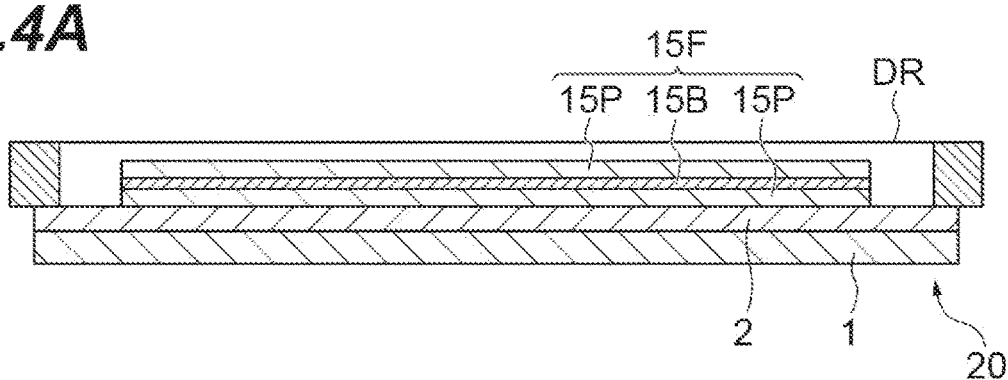
FIGS. 4A to 4D are cross-sectional views schematically showing an adhesive member manufacturing process.
Figure 4B:
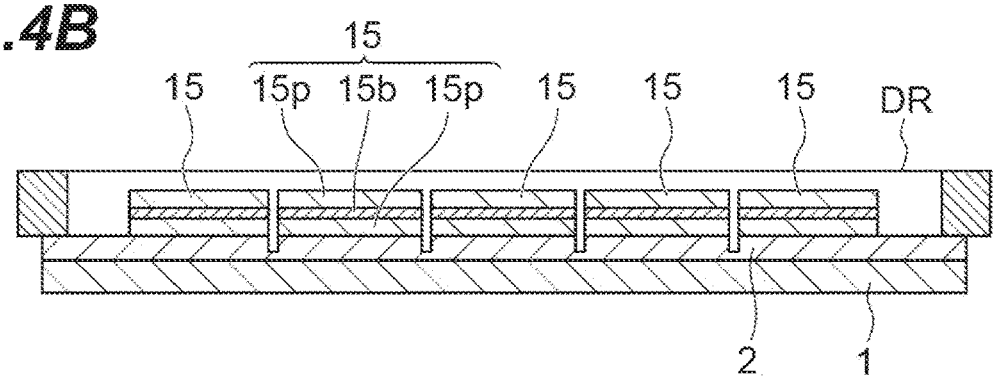
Figure 4C:
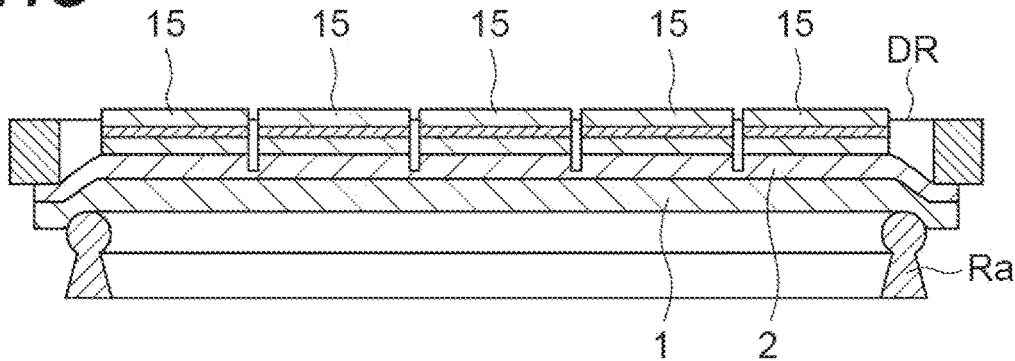
Figure 4D:
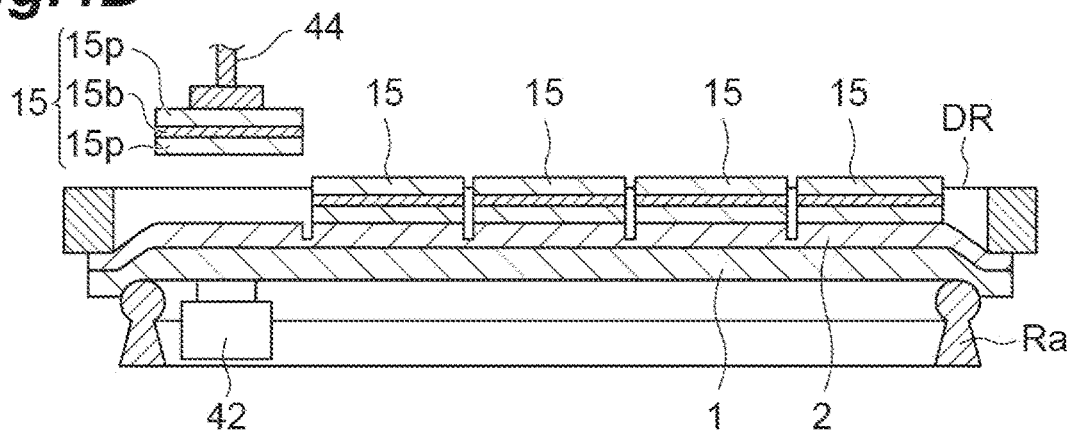

As shown in FIG. 4A, a dicing ring DR is attached to the stacked film 20. That is, the dicing ring DR is attached to the adhesive layer 2 of the stacked film 20, and the adhesive film 15F is arranged inside the dicing ring DR. The adhesive film 15F is separated into individual pieces by dicing (see FIG. 4B). As a result, a large number of adhesive members 15 are obtained from the adhesive film 15F. Thereafter, for example, the adhesive layer 2 is irradiated with ultraviolet rays to reduce the adhesive force between the adhesive layer 2 and the adhesive member 15. After the irradiation of ultraviolet rays, as shown in FIG. 4C, the base film 1 is expanded to make the adhesive members 15 spaced apart from each other. That is, tension is applied to the base film 1 by pushing up the inner region of the dicing ring DR in the base film 1 with the ring Ra, so that the adhesive members 15 are spaced apart from each other. As shown in FIG. 4D, the adhesive member 15 is peeled off from the adhesive layer 2 by pushing up the adhesive member 15 with a push-up jig 42, and the adhesive member 15 is picked up by suction using a suction collet 44. In addition, the curing reaction of the thermosetting resin may be advanced by heating the adhesive film 15F before dicing or the adhesive member 15 before picking up. If the adhesive member 15 is properly cured when picking up the adhesive member 15, excellent pick-up performance can be achieved. It is preferable that the cuts for singulation are formed up to the outer edge of the adhesive member 15. The diameter of the adhesive film 15F may be, for example, 300 to 310 mm or 300 to 305 mm. The shape of the adhesive film 15F in plan view is not limited to the circular shape shown in FIG. 2A, and may be a rectangle (a square or a rectangle).

Figure 17A:
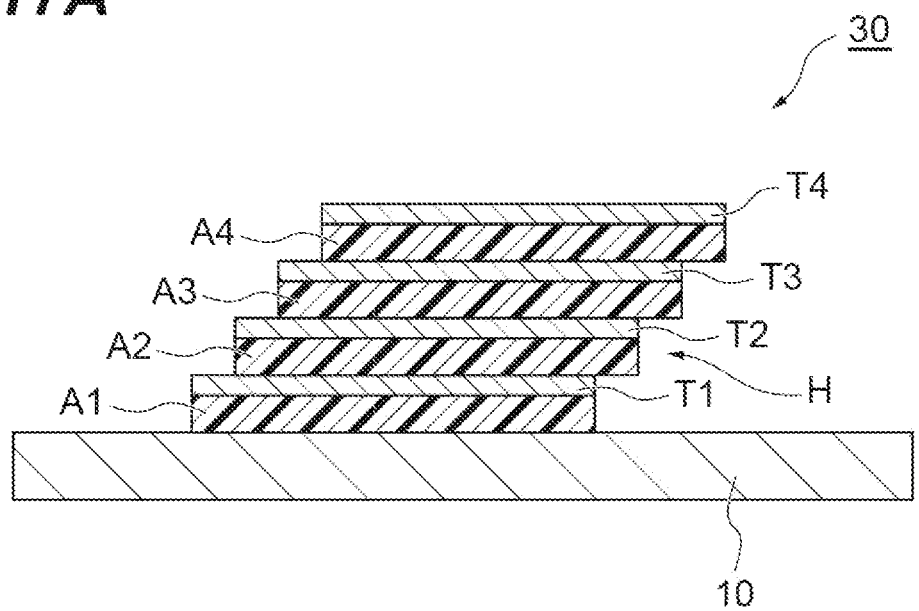
FIG. 17A is a cross-sectional view schematically showing a semiconductor device manufacturing process.
Figure 17B:
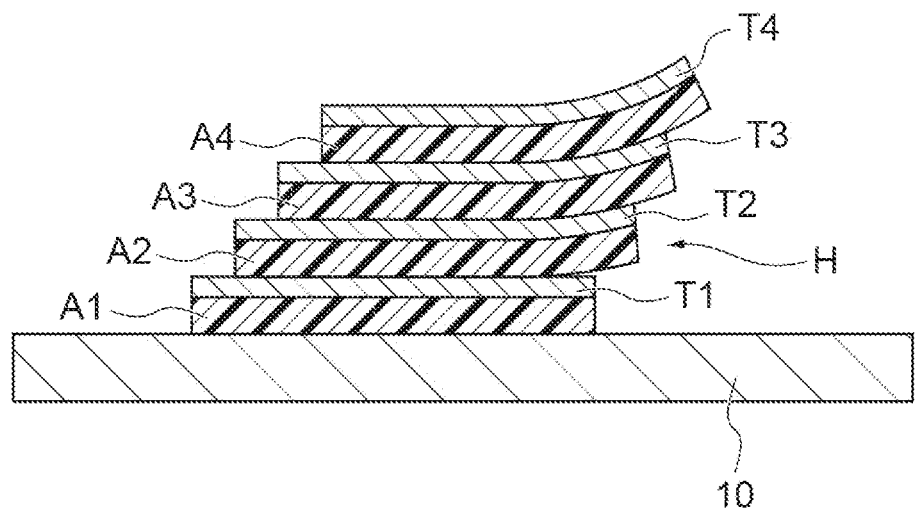
FIG. 17B is a cross-sectional view schematically showing a structure in which peeling occurs between a semiconductor element in the first stage and a semiconductor element in the second stage.

The chips T1, T2, T3, T4, and T5 shown in FIG. 1 are, for example, memory chips. The shapes of the chips T1, T2, T3, T4, and T5 in plan view are, for example, rectangles (squares or rectangles). The length of one side of each of the chips T1, T2, T3, T4, and T5 is, for example, 12 mm or less, and may be 6 to 10 mm or 2 to 4 mm. When these chips are rectangular in shape, the ratio B/A of the length B of the long side to the length A of the short side is, for example, 1.5 to 4, 1.8 to 3.5, or 2.1 to 3.2. The thicknesses of the chips T1, T2, T3, T4, and T5 are, for example, 10 to 170 μm, and may be 10 to 30 μm. These chips have a complex circuit layer (top surface side in FIG. 1) and a relatively thin semiconductor layer (bottom surface side in FIG. 1). As the ratio of the thickness of the semiconductor layer to the total thickness of the chip decreases, the chip tends to warp toward the smile side (see FIG. 17). For example, when this ratio is 80% or less, warping on the smile side tends to occur. In addition, the five chips T1, T2, T3, T4, and T5 may have the same length of one side or different lengths of one side, and this is the same for their thicknesses. Warping in the smile direction means that the chip is warped so as to be convex downward.

Figure 5:
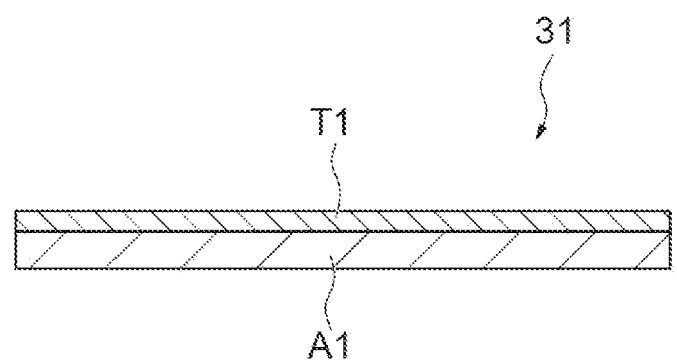
FIG. 5 is a cross-sectional view schematically showing an example of a chip with an adhesive piece.

The chips T1, T2, T3, T4, and T5 can be manufactured, for example, by attaching a dicing/die-bonding integrated film to a semiconductor wafer having a circuit surface and then performing a dicing step, a pick-up step, and the like. In this case, a large number of laminates (chips with adhesive pieces) of adhesive pieces formed by separating the die bonding into individual chips and chips formed by separating the semiconductor wafer into individual chips are obtained. FIG. 5 is a cross-sectional view schematically showing an example of a chip with an adhesive piece. A chip 31 with an adhesive piece shown in this diagram is formed by the chip T1 and the adhesive piece A1 (before curing) stacked on a surface of the chip T1 opposite to the circuit surface. In addition, the bottom surface of the chip T1 in FIG. 5 corresponds to the back surface of the chip. In recent years, the back surface of a chip is often uneven. Since substantially the entire back surface of the chip T1 is covered with the adhesive piece A1, it is possible to suppress cracking or splitting of the chip T1.

[Semiconductor Device Manufacturing Method]

The semiconductor device 100 is manufactured through the following steps.

Figure 6:
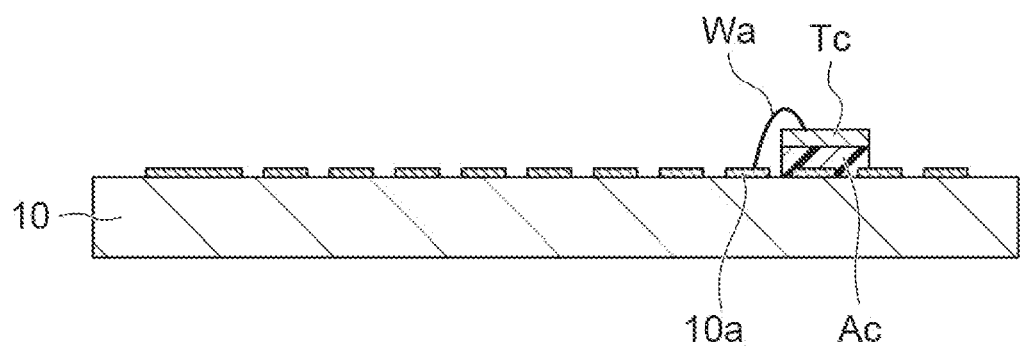
FIG. 6 is a cross-sectional view schematically showing a process of manufacturing the semiconductor device shown in FIG. 1.

(A1) A step of arranging the controller chip Tc on the surface of the substrate 10 (see FIG. 6).

Figure 7:
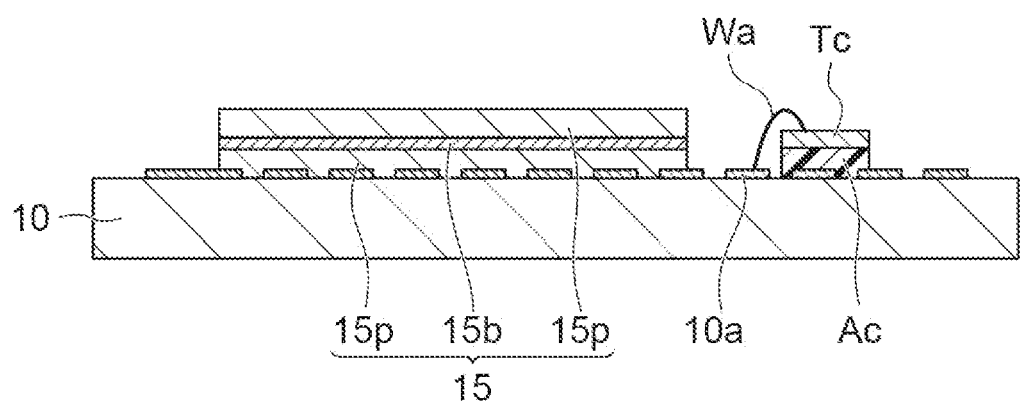
FIG. 7 is a cross-sectional view schematically showing a process of manufacturing the semiconductor device shown in FIG. 1.

(B1) A step of arranging the adhesive member 15 on the surface of the substrate 10 (see FIG. 7). In addition, the step (B1) may be performed after the step (A1), or the step (A1) may be performed after the step (B1).

Figure 8:
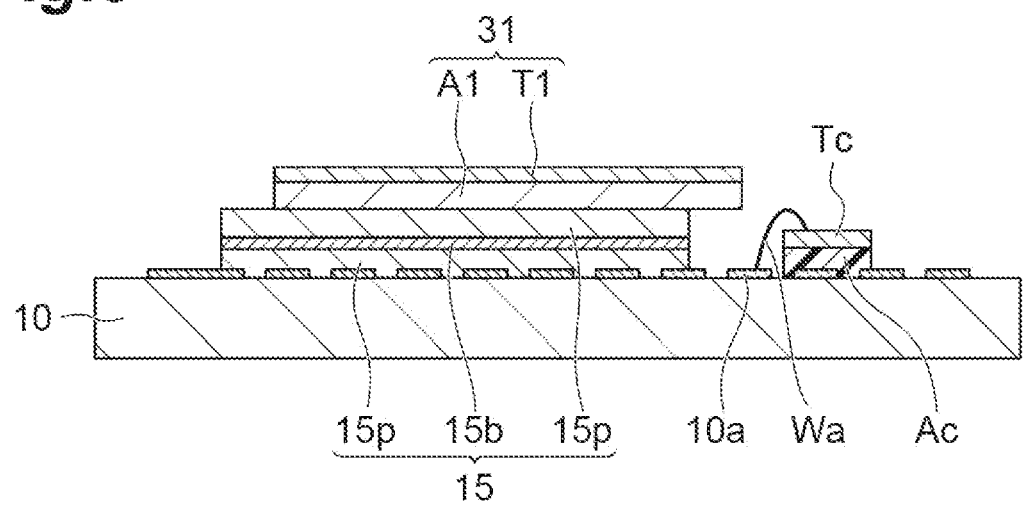
FIG. 8 is a cross-sectional view schematically showing a process of manufacturing the semiconductor device shown in FIG. 1.

(C1) A step of stacking the chip 31 with an adhesive piece on the surface of the adhesive member 15 (see FIG. 8).

Figure 9:
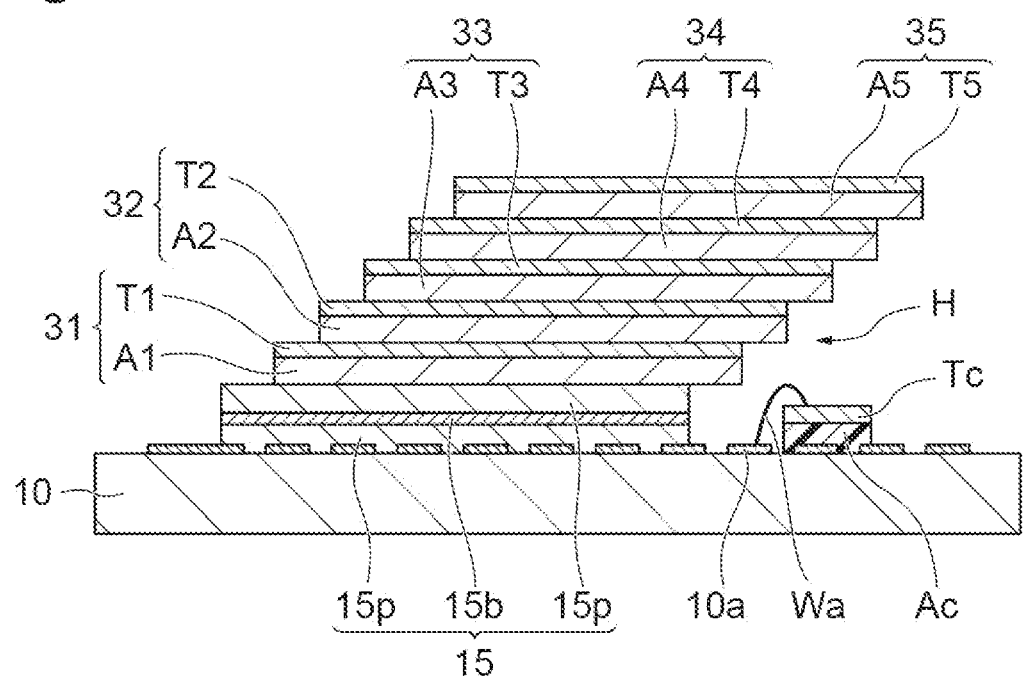
FIG. 9 is a cross-sectional view schematically showing a process of manufacturing the semiconductor device shown in FIG. 1.

(D1) A step of stacking a plurality of chips 32, 33, 34, and 35 with adhesive pieces on the surface of the chip T1 (see FIG. 9). As described above, due to the presence of the adhesive member 15, it is possible to suppress the warping of the chip itself. Therefore, it is possible to sufficiently suppress the generation of trap voids due to chip warping when the chip with an adhesive piece is pressure-bonded onto the surface of the chip.

(E1) A step of collectively curing the adhesive member 15 and the plurality of adhesive pieces A1, A2, A3, A4, and A5.

(F1) A step of sealing chips, wires, and the like on the surface of the substrate 10 with a sealing material (see FIG. 1).

According to the manufacturing method described above, since the first chip is stacked on the surface of the adhesive member with the first adhesive piece interposed therebetween, the interface on which the warping stress is likely to concentrate can be formed by the adhesive member and the first adhesive piece. For this reason, when stacking chips above the first chip thereafter, even if hardening treatment is performed collectively after stacking a predetermined number of chips without curing the adhesive pieces each time one chip is stacked, it is possible to sufficiently suppress the occurrence of peeling at the interface. The fact that a plurality of adhesive pieces interposed between a plurality of stacked chips can be collectively cured contributes to an improvement in manufacturing efficiency of semiconductor devices.

(Thermosetting Resin Composition)

Hereinafter, the thermosetting resin composition used for forming the surface layer 15p of the adhesive member 15 will be described. As described above, the thermosetting resin composition contains an epoxy resin, a curing agent, an elastomer, and further contains an inorganic filler, a curing accelerator, and the like when necessary. The surface layer 15p and the cured surface layer 15a preferably have the following characteristics.

Characteristic 1: When the adhesive member 15 is thermocompression bonded to a predetermined position of the substrate 10, positional deviation is unlikely to occur (the melt viscosity of the surface layer 15p at 120° C. is, for example, 4300 to 50000 Pa·s or 5000 to 40000 Pa·s)

Characteristic 2: The surface layer 15a shows stress relaxation in the semiconductor device 100 (the thermosetting resin composition contains an elastomer (rubber component))

Characteristic 3: The surface layer 15a has a high adhesive strength with respect to the adhesive piece A1 (the die shear strength of the surface layer 15a with respect to the adhesive piece A1 is, for example, 2.0 to 7.0 Mpa or 3.0 to 6.0 Mpa)

Characteristic 4: Shrinkage rate due to curing is sufficiently small

Characteristic 5: The visibility of the adhesive member 15 by a camera in the pick-up step is good (the thermosetting resin composition contains, for example, a coloring agent)

Characteristic 6: The surface layer 15a has a sufficient mechanical strength

[Epoxy Resin]

An epoxy resin is not particularly limited as long as the epoxy resin is cured to have an adhesive action. It is possible to use bifunctional epoxy resins, such as a bisphenol A type epoxy resin, a bisphenol F type epoxy resin, a bisphenol S type epoxy resin, and novolak type epoxy resins, such as a phenol novolac type epoxy resin and a cresol novolak type epoxy resin. In addition, it is possible to apply commonly known resins, such as a polyfunctional epoxy resin, a glycidylamine type epoxy resin, a heterocycle-containing epoxy resin, and an alicyclic epoxy resins. Each type of these may be used individually, or two or more types may be used together.

[Curing Agent]

Examples of a curing agent include a phenolic resin, an ester compound, an aromatic amine, an aliphatic amine, and an acid anhydride. Among these, a phenol resin is preferable from the viewpoint of achieving high die shear strength. Examples of commercially available phenolic resins include LF-4871 (product name, BPA novolac type phenolic resin) manufactured by DIC Corporation, HE-100C-30 (product name, phenylarachyl type phenolic resin) manufactured by Air Water Inc., Phenolite KA and TD series manufactured by DIC Corporation, Milex XLC-series and XL series (for example, Milex XLC-LL) manufactured by Mitsui Chemicals, Inc., HE series (for example, HE100C-30) manufactured by AIR WATER INC., MEHC-7800 series (for example, MEHC-7800-4S) manufactured by Meiwa Kasei Industries, Ltd., and JDPP series manufactured by JFE Chemical Corporation. Each type of these may be used individually, or two or more types may be used together.

As for the blending amount of the epoxy resin and the phenol resin, from the viewpoint of achieving high die shear strength, an equivalent ratio between the epoxy equivalent and the hydroxyl equivalent is preferably 0.6 to 1.5, more preferably 0.7 to 1.4, even more preferably 0.8 to 1.3. When the blending ratio is within the above range, both curability and fluidity can be easily achieved at sufficiently high levels.

[Elastomer]

Examples of an elastomer include an acrylic resin, a polyester resin, a polyamide resin, a polyimide resin, a silicone resin, polybutadiene, acrylonitrile, epoxy-modified polybutadiene, maleic anhydride-modified polybutadiene, phenol-modified polybutadiene, and carboxy-modified acrylonitrile.

From the viewpoint of achieving high die shear strength, an acrylic resin is preferable as an elastomer, and an acrylic resin such as epoxy group-containing (meth)acrylic copolymer obtained by polymerizing a functional monomer having an epoxy group or a glycidyl group, such as glycidyl acrylate or glycidyl methacrylate, as a crosslinkable functional group is more preferable. Among acrylic resins, an epoxy group-containing (meth)acrylic acid ester copolymer and an epoxy group-containing acrylic rubber are preferable, and the epoxy group-containing acrylic rubber is more preferable. The epoxy group-containing acrylic rubber is a rubber having an epoxy group, which has an acrylic acid ester as a main component and which is mainly composed of a copolymer of butyl acrylate and acrylonitrile or a copolymer of ethyl acrylate and acrylonitrile. In addition, the acrylic resin may have not only the epoxy group but also the crosslinkable functional group such as an alcoholic or phenolic hydroxyl group and a carboxyl group.

Commercially available acrylic resins include SG-70L, SG-708-6, WS-023 EK30, SG-280 EK23, SG-P3 solvent change product (product name, acrylic rubber, weight average molecular weight: 800000, Tg: 12° C., solvent is cyclohexanone) manufactured by Nagase ChemteX Corporation.

The glass transition temperature (Tg) of the acrylic resin is preferably −50° C. to 50° C., more preferably −30° C. to 30° C., from the viewpoint of achieving high die shear strength. The weight average molecular weight (Mw) of the acrylic resin is preferably 100000 to 3000000, more preferably 500000 to 2000000 from the viewpoint of achieving high die shear strength. Here, Mw means a value that is measured by gel permeation chromatography (GPC) and converted by using a standard polystyrene calibration curve. In addition, by using an acrylic resin with a narrow molecular weight distribution, a highly elastic adhesive piece tends to be formed.

From the viewpoint of achieving high die shear strength, the amount of acrylic resin contained in the thermosetting resin composition is preferably 10 to 200 parts by mass with respect to the total of 100 parts by mass of the epoxy resin and epoxy resin curing agent, more preferably 20 to 100 parts by mass.

[Inorganic Filler]

Examples of an inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride and crystalline silica, and amorphous silica. Each type of these may be used individually, or two or more types may be used together.

From the viewpoint of achieving high die shear strength, the average particle size of the inorganic filler is preferably 0.005 µm to 1.0 µm, more preferably 0.05 to 0.5 µm. From the viewpoint of achieving high die shear strength, the surface of the inorganic filler is preferably chemically modified. A silane coupling agent is a suitable material for chemically modifying the surface. Examples of types of functional groups in the silane coupling agent include a vinyl group, an acryloyl group, an epoxy group, a mercapto group, an amino group, a diamino group, an alkoxy group, and an ethoxy group.

From the viewpoint of achieving high die shear strength, the content of the inorganic filler is preferably 20 to 200 parts by mass, more preferably 30 to 100 parts by mass with respect to 100 parts by mass of the resin component of the thermosetting resin composition.

[Curing Accelerator]

Examples of a curing accelerator include imidazoles and derivatives thereof, an organophosphorus compound, secondary amines, tertiary amines, and quaternary ammonium salts. From the viewpoint of achieving high die shear strength, the imidazole compound is preferable. Examples of imidazoles include 2-methylimidazole, 1-benzyl-2-methylimidazole, 1-cyanoethyl-2-phenylimidazole, and 1-cyanoethyl-2-methylimidazole. Each type of these may be used individually, or two or more types may be used together.

From the viewpoint of achieving high die shear strength, the content of the curing accelerator in the thermosetting resin composition is preferably 0.04 to 3 parts by mass, more preferably 0.04 to 0.2 parts by mass with respect to the total of 100 parts by mass of the epoxy resin and the epoxy resin curing agent.

Second Embodiment

[Semiconductor Device]

Figure 10:
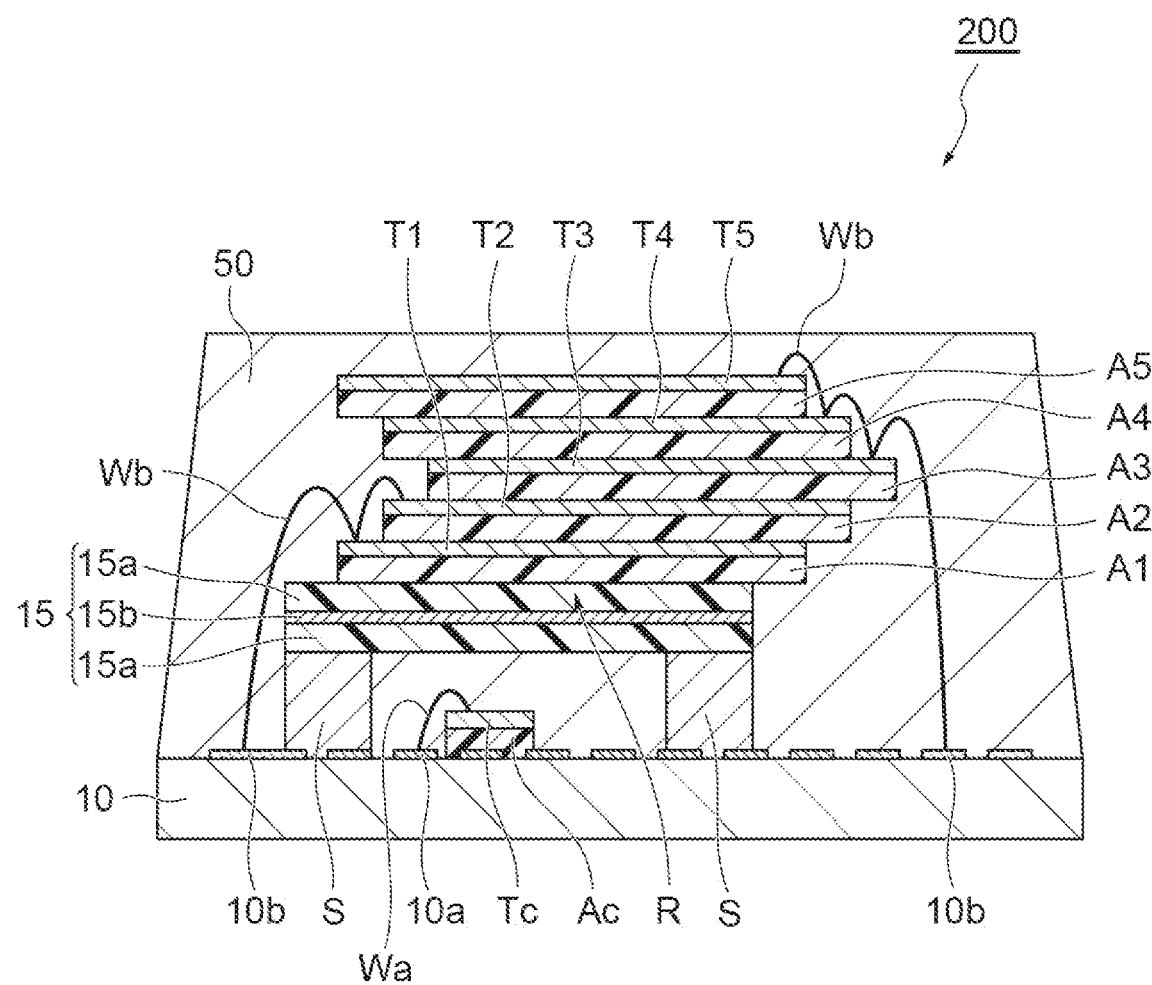
FIG. 10 is a cross-sectional view schematically showing a second embodiment of a semiconductor device according to the present disclosure.

FIG. 10 is a cross-sectional view schematically showing a semiconductor device according to the present embodiment. A semiconductor device 200 shown in this diagram includes a substrate 10, a controller chip Tc arranged on the substrate 10, a plurality of support pieces S arranged around the controller chip Tc on the substrate 10, an adhesive member 15 supported by the plurality of support pieces S and arranged so as to cover the controller chip Tc, five chips T1, T2, T3, T4, and T5 stacked on the surface of the adhesive member 15, wires Wa and Wb for electrically connecting electrodes 10a and 10b on the surface of the substrate 10 to the chips, and a sealing layer 50 for sealing these. An adhesive piece A1 is arranged between the adhesive member 15 and the chip T1. An adhesive piece A2 is arranged between the chip T1 and the chip T2. An adhesive piece A3 is arranged between the chip T2 and the chip T3. An adhesive piece A4 is arranged between the chip T3 and the chip T4. An adhesive piece A5 is arranged between the chip T4 and the chip T5.

According to the semiconductor device 200, since the interface on which the warping stress is likely to concentrate is formed by the adhesive member 15 and the adhesive piece A1, a sufficiently high adhesive strength can be obtained. Therefore, it is possible to suppress the occurrence of peeling at the interface. In addition, according to the semiconductor device 200, since the chip T1 is arranged so as to cover the controller chip Tc, it is possible to save the space. Hereinafter, the semiconductor device 200 will be mainly described focusing on the differences from the semiconductor device 100 according to the first embodiment.

In the present embodiment, a dolmen structure is formed on the substrate 10 by a plurality of support pieces S and the adhesive member 15. In addition, the dolmen is a kind of stone tomb, and includes a plurality of pillar stones and a plate-shaped rock placed thereon. In the semiconductor device 200, the support piece S corresponds to a "pillar stone" and the adhesive member 15 corresponds to a "plate-shaped rock".

The support piece S plays a role of a spacer that forms a space around the controller chip Tc. The entire support piece S is formed of, for example, a cured product of a thermosetting resin composition. The support piece S may be a laminate (dummy chip) of a chip and an adhesive piece provided on one surface of the chip, or may have a multilayer structure similar to the adhesive member 15. By making the support piece S have a plurality of layers formed of different materials, functions can be assigned to respective layers. Therefore, compared with a case where a plurality of layers are formed of the same material, it is possible to improve the functionality of the support piece.

Figure 11A:
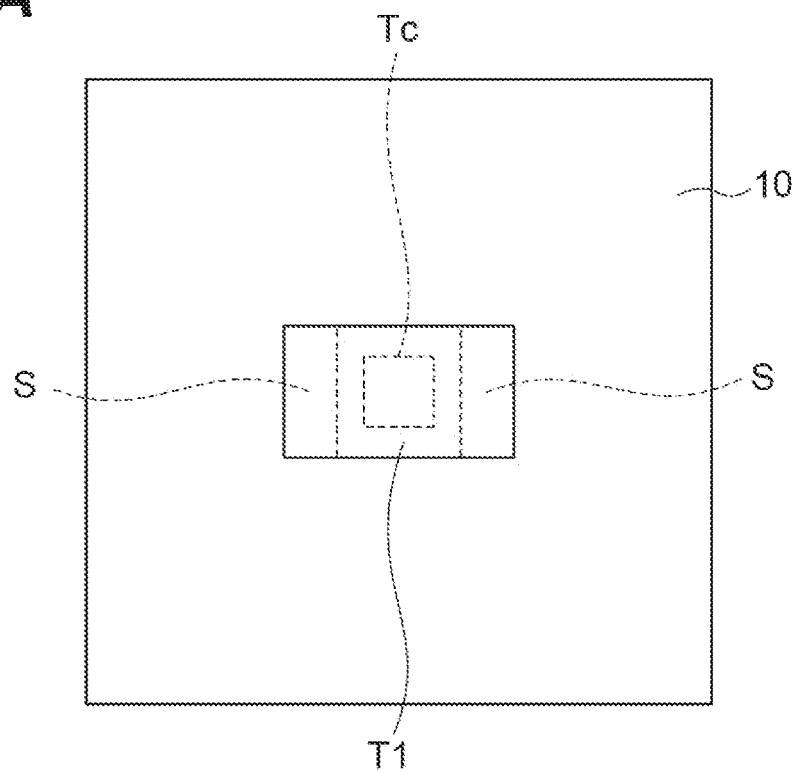
FIGS. 11A and 11B are plan views schematically showing an example of the positional relationship between a chip and a plurality of support pieces.
Figure 11B:
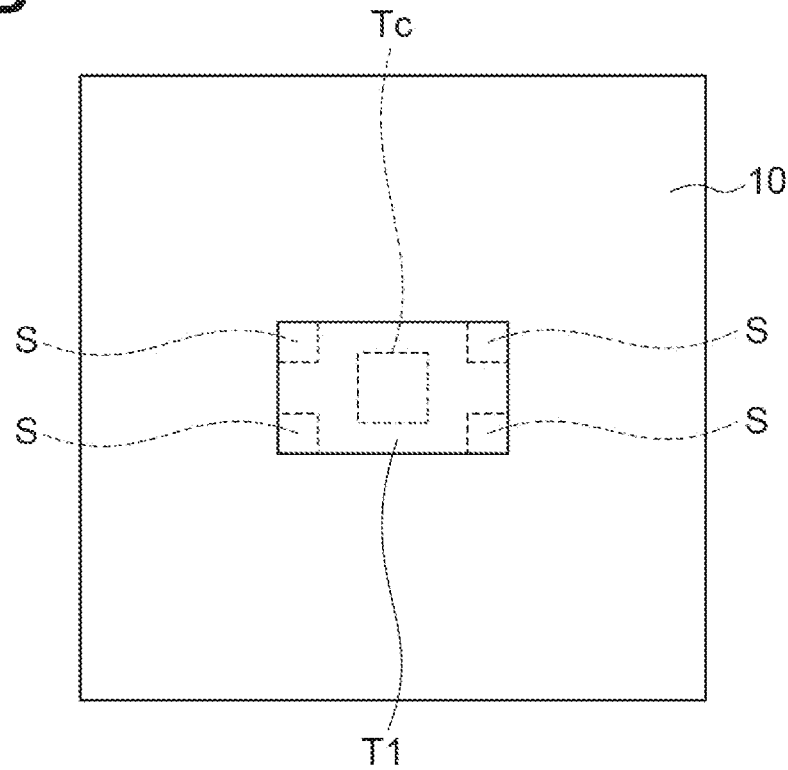

As shown in FIG. 11A, two support pieces S (shape: rectangle) may be arranged at positions spaced apart from each other on both sides of the controller chip Tc, or as shown in FIG. 11B, one support piece S (shape: square, four pieces in total) may be arranged at a position corresponding to each corner of the chip T1. The length of one side of the support piece S in plan view is, for example, 20 mm or less, and may be 1 to 20 mm or 1 to 12 mm. The thickness (height) of the support piece S is, for example, 10 to 180 µm, and may be 20 to 120 µm.

The chip T1 is spaced apart from the adhesive member 15. By appropriately setting the thickness of the support piece S, it is possible to secure a space for the wire Wa that connects the top surface of the chip T1 and the substrate 10 to each other. As shown in FIG. 10, the adhesive member 15 covers a region R of the adhesive piece A1 facing the controller chip Tc and continuously extends to the top surfaces of the plurality of support pieces S.

[Semiconductor Device Manufacturing Method]

The semiconductor device 200 is manufactured through the following steps.

Figure 12:
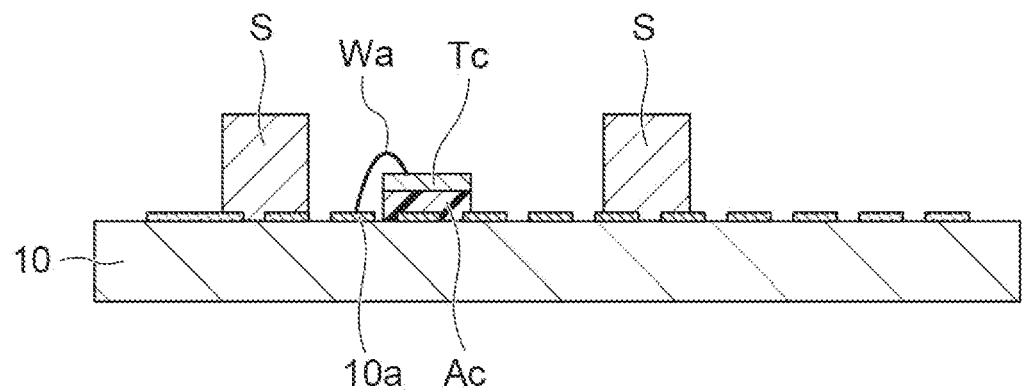
FIG. 12 is a cross-sectional view schematically showing a process of manufacturing the semiconductor device shown in FIG. 10.

(A2) A step of arranging the controller chip Tc on the surface of the substrate 10 and arranging a plurality of support pieces S around the controller chip Tc (see FIG. 12). In addition, the plurality of support pieces S may be arranged after the controller chip Tc is arranged, or the controller chip Tc may be arranged after the plurality of support pieces S are arranged.

Figure 13:
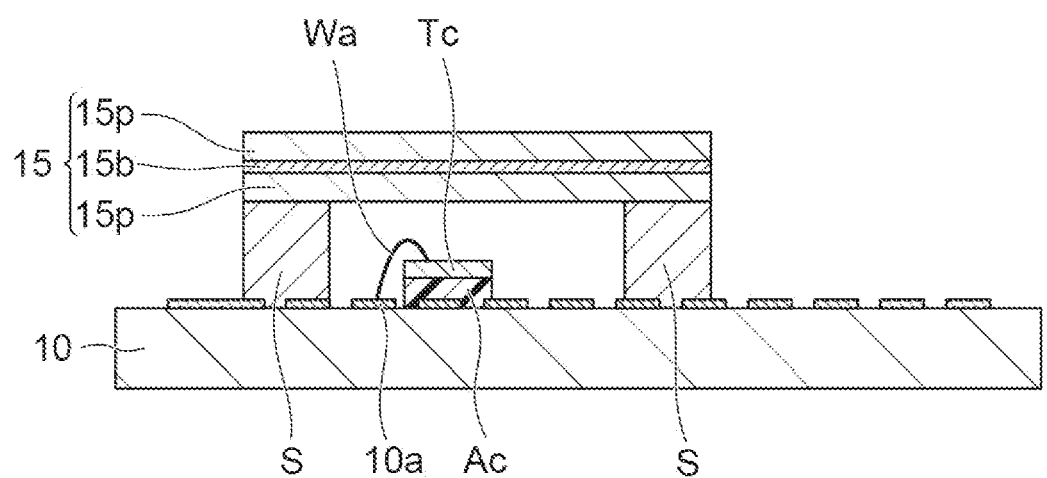
FIG. 13 is a cross-sectional view schematically showing a process of manufacturing the semiconductor device shown in FIG. 10.

(B2) A step of arranging the adhesive member 15 so as to be supported by the plurality of support pieces S and cover the controller chip Tc (see FIG. 13).

Figure 14:
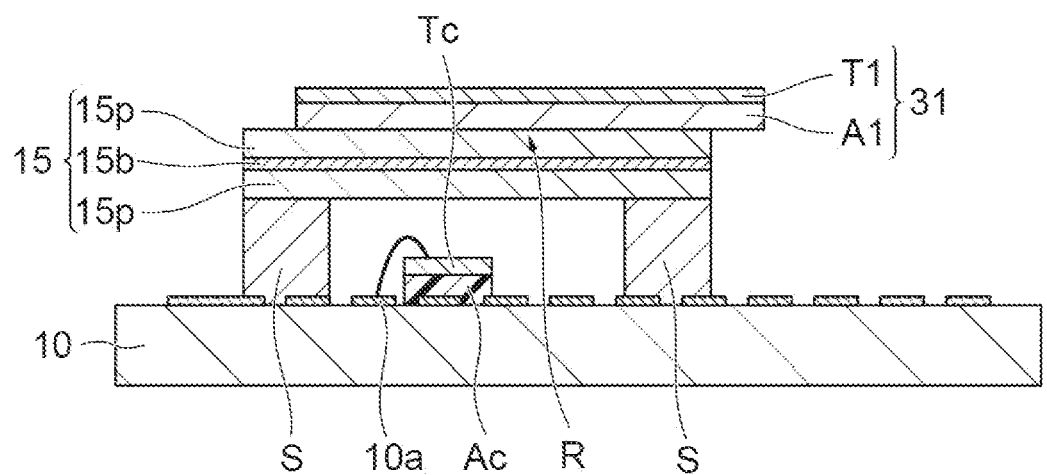
FIG. 14 is a cross-sectional view schematically showing a process of manufacturing the semiconductor device shown in FIG. 10.

(C2) A step of stacking the chip 31 with an adhesive piece on the surface of the adhesive member 15 (see FIG. 14).

Figure 15:
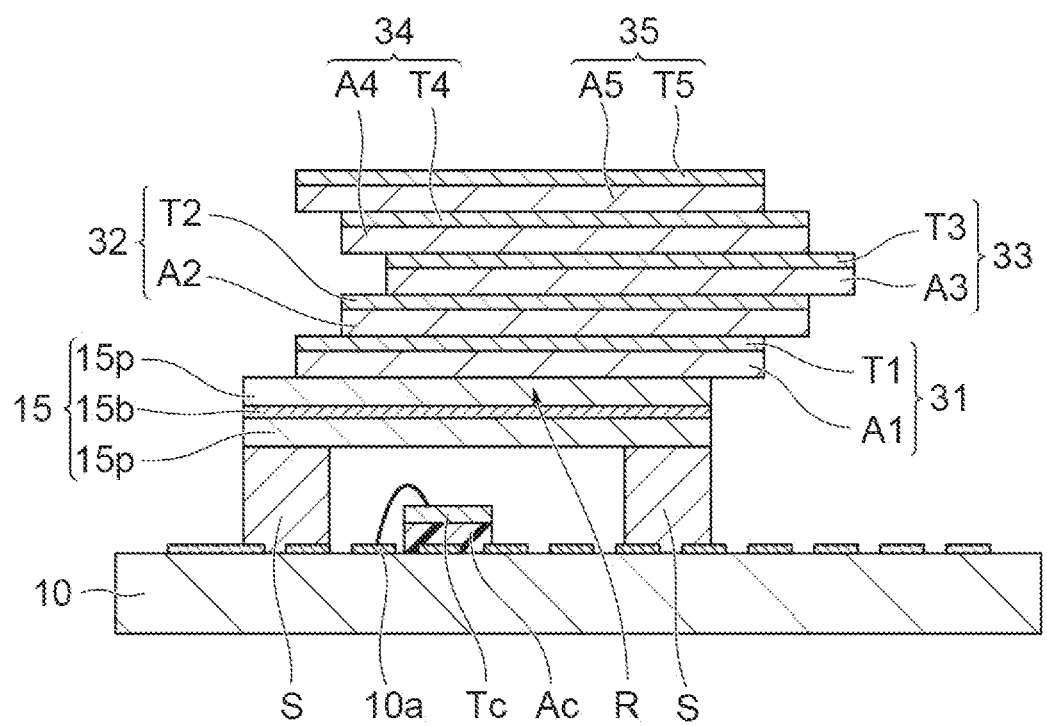
FIG. 15 is a cross-sectional view schematically showing a process of manufacturing the semiconductor device shown in FIG. 10.

(D2) A step of stacking a plurality of chips 32, 33, 34, and 35 with adhesive pieces on the surface of the chip 31 with an adhesive piece (see FIG. 15). As shown in FIG. 15, the chip 32 with an adhesive piece is arranged at a position shifted in the horizontal direction (right direction in FIG. 15) with respect to the chip T1, and the chip 33 with an adhesive piece is arranged at a position shifted in the same horizontal direction (right direction in FIG. 15) with respect to the chip T2. Thereafter, the chip 34 with an adhesive piece is arranged at a position shifted in the opposite horizontal direction (left direction in FIG. 15) with respect to the chip T3, and the chip 35 with an adhesive piece is arranged at a position shifted in the same horizontal direction (left direction in FIG. 15) with respect to the chip T4. As a result, it is possible to secure a space for connecting wires to the chip, and it is possible to save the space.

(E2) A step of collectively curing the adhesive member 15 and the plurality of adhesive pieces A1, A2, A3, A4, and A5.

(F2) A step of sealing chips, wires, and the like on the surface of the substrate 10 with a sealing material (see FIG. 10).

Third Embodiment

Figure 16:
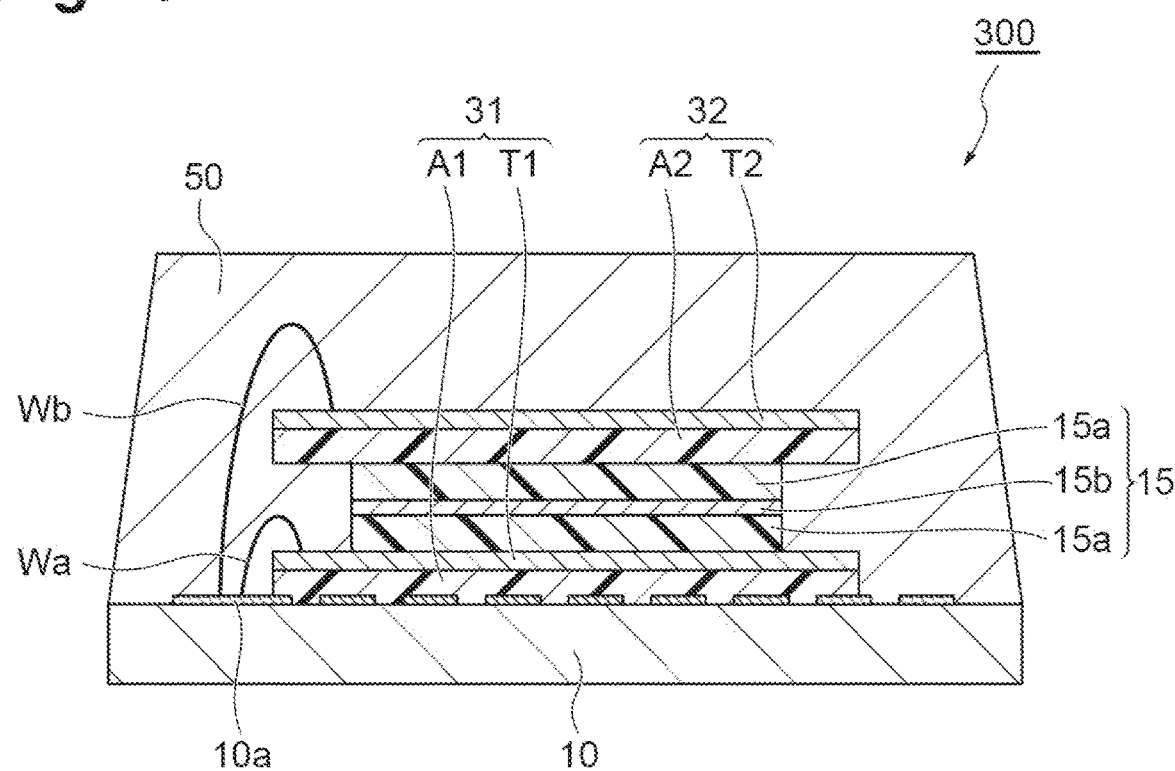
FIG. 16 is a cross-sectional view schematically showing a third embodiment of a semiconductor device according to the present disclosure.

FIG. 16 is a cross-sectional view schematically showing a semiconductor device according to the present embodiment. A semiconductor device 300 shown in this diagram includes a substrate 10, two chips 31 and 32 with adhesive pieces stacked on the surface of the substrate 10, and an adhesive member 15 arranged between the two chips 31 and 32 with adhesive pieces, wires Wa and Wb for electrically connecting electrode 10a on the surface of the substrate 10 and the chips T1 and T2 to each other, and a sealing layer 50 for sealing these. An adhesive piece A2 is arranged between the adhesive member 15 and the chip T2.

Side portions (parts of peripheral portions) of the chips 31 and 32 with adhesive pieces protrude laterally from the adhesive member 15. In plan view, the adhesive member 15 has a smaller area than the chips 31 and 32 with adhesive pieces, and the side portions of the top surface of the chip T1 are not covered with the adhesive member 15. The side portions of the bottom surface of the adhesive piece A2 are not covered with the adhesive member 15 either. According to the semiconductor device 300, since the interface on which the warping stress is likely to concentrate is formed by the adhesive member 15 and the adhesive piece A2, a sufficiently high adhesive strength can be obtained. Therefore, it is possible to suppress the occurrence of peeling at the interface.

While the plurality of embodiments of the present disclosure have been described above in detail, the present invention is not limited to the above embodiments. For example, in the first and second embodiments, the case is exemplified in which the chip 31 with an adhesive piece (a laminate of the adhesive piece A1 and the chip T1) is arranged at a position shifted in the horizontal direction (right direction in FIGS. 8 and 14) with respect to the adhesive member 15. However, the chip 31 with an adhesive piece may be arranged immediately above the adhesive member 15. By arranging the chip T1 on the surface of the adhesive member 15, it is easy to secure a distance from the surface of the substrate 10 to the chip T1. Therefore, it is possible to sufficiently suppress the occurrence of a situation in which the chip T1 comes into contact with another member arranged on the surface of the substrate 10 (for example, the controller chip Tc shown in FIG. 8). In addition, even when an adhesive member formed of a bonding adhesive layer (single layer) having a similar thickness to the adhesive member 15 is used instead of the adhesive member 15 having a three-layer structure, it is possible to secure the above distance. However, since such an adhesive member is inferior to the adhesive member 15 in machinability and handleability, the productivity of semiconductor devices is also lowered.

INDUSTRIAL APPLICABILITY

According to the present disclosure, there are provided a semiconductor device, which includes a plurality of stacked chips and which can sufficiently suppress the occurrence of peeling due to warping of the chips inside the semiconductor device, and a method for efficiently manufacturing the same.

REFERENCE SIGNS LIST

1: base film, 2: adhesive layer, 3: cover film, 10: substrate, 10a, 10b: electrode, 15: adhesive member, 15a, 15p, 15P: surface layer, 15b, 15B: intermediate layer, 15F: adhesive film, 20: stacked film for forming adhesive member, 31, 32, 33, 34, 35: chip with adhesive piece, 42: push-up jig, 44: suction collet, 50: sealing layer, 100, 200, 300: semiconductor device, A1, A2, A3, A4, A5, Ac: adhesive piece, DR: dicing ring, H: overhang portion, R: region, S: support piece, T1, T2, T3, T4, T5: chip, Tc: controller chip, Wa, Wb: wire.

The invention claimed is:

1. A semiconductor device, comprising:
a substrate;
an adhesive member arranged on or above a surface of the substrate, wherein the adhesive member has a multilayer structure including a pair of surface layers formed of a cured product of a thermosetting resin composition and an intermediate layer arranged between the pair of surface layers;
a first chip stacked on the adhesive member with a first adhesive piece interposed therebetween, wherein the first adhesive piece contacts both the first chip and the adhesive member; and
a second chip stacked on the first chip with a second adhesive piece interposed therebetween.

2. The semiconductor device according to claim 1, further comprising:
a third chip on the surface of the substrate; and
a plurality of support pieces arranged around the third chip on the surface of the substrate,
wherein the adhesive member is supported above the surface of the substrate by the plurality of support pieces and covers the third chip.

3. The semiconductor device according to claim 1, wherein at least a part of a peripheral portion of the second chip protrudes laterally from the first chip.

4. The semiconductor device according to claim 1, wherein in the multilayer structure of the adhesive member, the pair of surface layers and the intermediate layer are entirely aligned in a lateral direction of the semiconductor device, and wherein at least a part of a peripheral portion of the first chip protrudes from the multilayer structure of the adhesive member in the lateral direction.

5. The semiconductor device according to claim 1, wherein the intermediate layer is a polyimide layer.

6. The semiconductor device according to claim 1, wherein the intermediate layer is a metal layer.

7. The semiconductor device according to claim 1, wherein the semiconductor device is a three-dimensional NAND memory.

8. The semiconductor device according to claim 1, wherein the pair of surface layers included in the multilayer structure are formed of cured products of the same thermosetting resin composition.

9. The semiconductor device according to claim 1, wherein the pair of surface layers of the adhesive member includes a first surface layer that contacts the substrate and a second surface layer that contacts the first adhesive piece.

10. A semiconductor device manufacturing method, comprising:
arranging an adhesive member on or above a surface of a substrate, wherein the adhesive member has a multilayer structure including a pair of surface layers formed of a thermosetting resin composition and an intermediate layer arranged between the pair of surface layers, and wherein the pair of surface layers includes a first surface layer facing the substrate and a second surface layer facing away from the substrate;
stacking a first chip on the adhesive member with a first adhesive piece interposed therebetween, wherein the first adhesive piece contacts the first chip and the second surface layer of the adhesive member;
stacking a second chip on the first chip with a second adhesive piece interposed therebetween; and
curing the adhesive member, the first adhesive piece, and the second adhesive piece.

11. The semiconductor device manufacturing method according to claim 10, wherein the pair of surface layers included in the multilayer structure are formed of the same thermosetting resin composition.

12. The semiconductor device manufacturing method according to claim 10,
wherein the first and second adhesive pieces are formed of a thermosetting resin composition, and
wherein the adhesive member, the first adhesive piece, and the second adhesive piece are collectively cured.

13. The semiconductor device manufacturing method according to claim 10, further comprising
arranging a third chip on the surface of the substrate; and
arranging a plurality of support pieces around the third chip on the surface of the substrate,
wherein the adhesive member is arranged to be supported by the plurality of support pieces above the surface of the substrate, and to cover the third chip.

14. A semiconductor device, comprising:
a substrate;
an adhesive member arranged above a surface of the substrate, wherein the adhesive member has a multilayer structure including a pair of surface layers formed of a cured product of a thermosetting resin composition and an intermediate layer arranged between the pair of surface layers;
a first chip stacked on the adhesive member with a first adhesive piece interposed therebetween;
a second chip stacked on the first chip with a second adhesive piece interposed therebetween;
a third chip arranged on the surface of the substrate; and
a plurality of support pieces arranged around the third chip on the surface of the substrate, wherein the adhesive member is supported by the plurality of support pieces and covers the third chip.

15. The semiconductor device according to claim 14, wherein at least a part of a peripheral portion of the second chip with the second adhesive piece protrudes laterally from the adhesive member.

16. The semiconductor device according to claim 14, wherein the intermediate layer is a polyimide layer.

17. The semiconductor device according to claim 14, wherein the intermediate layer is a metal layer.

18. The semiconductor device according to claim 14, wherein the semiconductor device is a three-dimensional NAND memory.

19. The semiconductor device according to claim 14, wherein the pair of surface layers included in the multilayer structure are formed of cured products of the same thermosetting resin composition.

20. The semiconductor device according to claim 14, wherein the pair of surface layers of the adhesive member includes a first surface layer that faces the substrate and a second surface layer that contacts the first adhesive piece.

* * * * *